United States Patent
Tu

(10) Patent No.: US 9,112,097 B2
(45) Date of Patent: Aug. 18, 2015

(54) ALIGNMENT FOR METALLIZATION

(71) Applicant: Xiuwen Tu, San Jose, CA (US)

(72) Inventor: Xiuwen Tu, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 32 days.

(21) Appl. No.: 14/040,177

(22) Filed: Sep. 27, 2013

(65) Prior Publication Data

US 2015/0093851 A1    Apr. 2, 2015

(51) Int. Cl.
*H01L 21/00* (2006.01)
*H01L 31/18* (2006.01)

(52) U.S. Cl.
CPC ...................................... *H01L 31/18* (2013.01)

(58) Field of Classification Search
None
See application file for complete search history.

(56) References Cited

U.S. PATENT DOCUMENTS

| | | | | |
|---|---|---|---|---|
| 4,243,432 | A * | 1/1981 | Jordan et al. | 136/244 |
| 4,262,411 | A * | 4/1981 | Jordan et al. | 438/80 |
| 4,313,022 | A * | 1/1982 | Jordan et al. | 136/244 |
| 4,745,078 | A * | 5/1988 | Stetter et al. | 438/74 |
| 6,468,828 | B1 * | 10/2002 | Glatfelter et al. | 438/80 |
| 8,691,694 | B2 * | 4/2014 | Hieslmair | 438/678 |
| 8,735,738 | B2 * | 5/2014 | Wen et al. | 174/261 |
| 2008/0216887 | A1 | 9/2008 | Hacke et al. | |
| 2012/0132273 | A1 | 5/2012 | Lee et al. | |
| 2013/0000715 | A1 | 1/2013 | Moslehi et al. | |
| 2013/0112233 | A1 | 5/2013 | Coakley | |

FOREIGN PATENT DOCUMENTS

KR    10-2008-0050862    6/2008

OTHER PUBLICATIONS

International Search Report and Written Opinion from PCT/US2014/057553 mailed Dec. 30, 2014, 10 pgs.

* cited by examiner

*Primary Examiner* — Charles Garber
*Assistant Examiner* — Evren Seven
(74) *Attorney, Agent, or Firm* — Blakely Sokoloff Taylor & Zafman LLP

(57) ABSTRACT

Forming a metal layer on a solar cell. Forming a metal layer can include placing a patterned metal foil on the solar cell, where the patterned metal foil includes a positive busbar, a negative busbar, a positive contact finger extending from the positive busbar, a negative contact finger extending from the negative busbar, a metal strip, and one or more tabs. The positive and negative busbars and the positive and negative contact fingers can be connected to one another by the metal strip and tabs. Forming the metal layer can further include coupling the patterned metal foil to the solar cell and removing the metal strip and tabs. Removing the metal strip and tabs can separate the positive and negative busbars and contact fingers.

20 Claims, 9 Drawing Sheets

US 9,112,097 B2

ALIGNMENT FOR METALLIZATION

TECHNICAL FIELD

Embodiments of the subject matter described herein relate generally to photovoltaic assemblies including solar cells, photovoltaic laminates and photovoltaic modules. More particularly, embodiments of the subject matter relate to solar cells, photovoltaic laminates and fabrication processes.

BACKGROUND

Solar cells are well known devices for converting solar radiation to electrical energy. They can be fabricated on a semiconductor wafer using semiconductor processing technology. A photovoltaic cell or a solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact regions and contact fingers allow an external electrical circuit to be coupled to and be powered by the solar cell. Solar cells can be packaged into a photovoltaic laminate using various processes and encapsulant materials, where photovoltaic laminates can be further packaged to into a photovoltaic module. One or more embodiments pertain to photovoltaic cells or solar cells and photovoltaic laminate fabrication processes.

BRIEF SUMMARY

In an embodiment, a method for metallization of a first solar cell is disclosed. The method can include placing a patterned metal foil, or a perforated metal foil, on the first solar cell. The patterned metal foil can include a positive busbar, a negative busbar, a positive contact finger extending from the positive busbar, a negative contact finger extending from the negative busbar, a metal strip, and tabs. The patterned metal foil can also include the metal strip and tabs connecting the positive and negative contact fingers. The method can also include coupling the patterned metal foil to the first solar cell and removing the tabs and metal strip, where the positive and negative busbars are no longer connected to one another after removal of the metal strip.

In an embodiment, another method for metallization of a first solar cell is disclosed. The method can include patterning a metal foil using an ablation process. The method can further include placing the patterned metal foil on the first solar cell using a visual alignment system, the patterned metal foil having positive and negative busbars connected to one another by a metal strip and tabs. The method also includes coupling the patterned metal foil to the first solar cell and removing tabs and a metal strip of the patterned metal foil by pulling an edge of the metal strip, where the positive and negative busbars are no longer connected to one another after removal of the metal strip.

In an embodiment, a method for metallization of a photovoltaic laminate is disclosed. The method can include placing an encapsulant on a substantially transparent layer. The method can further include placing a first solar cell on the encapsulant. The method can further include placing a patterned metal foil on the first solar cell, the patterned metal foil having positive and negative busbars connected to one another by a metal strip and tabs. The method can include coupling the patterned metal foil to the first solar cell and removing the tabs and metal strip, where the positive and negative busbars are no longer connected to one another after removal of the metal strip and tabs.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
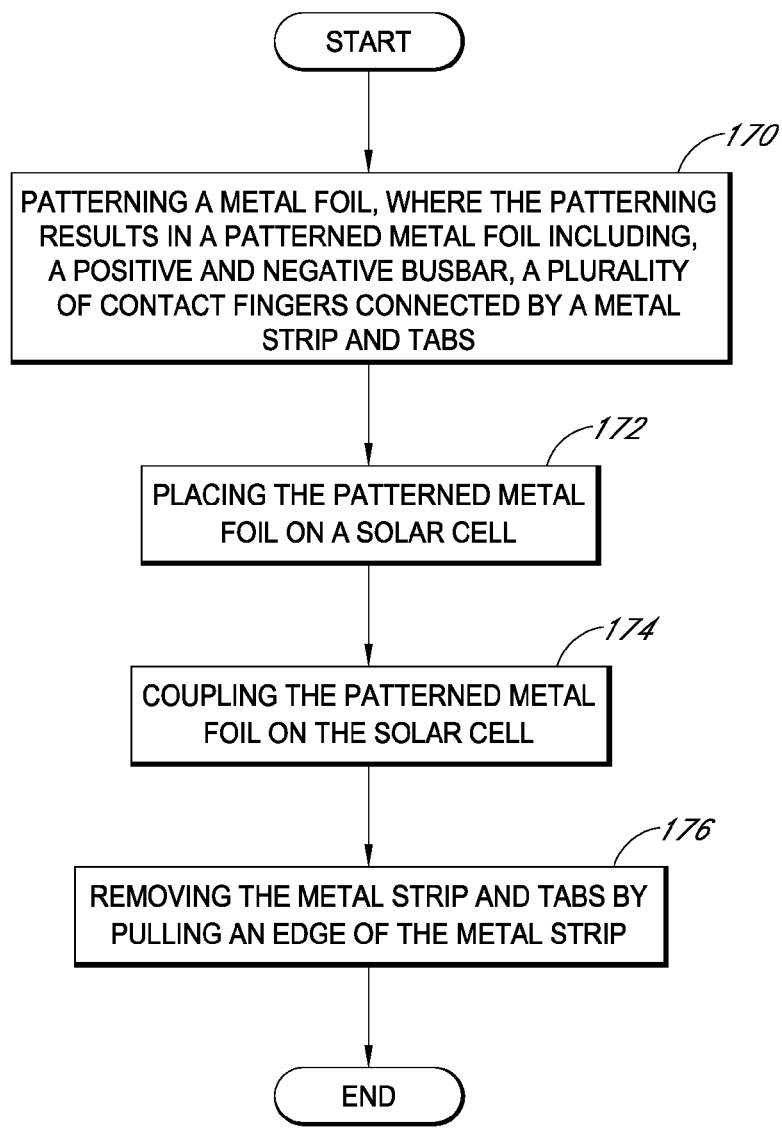
FIG. 1 is a flow chart representation of an example method for metallization of a solar cell, according to some embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells, photovoltaic laminates and solar modules for ease of understanding, the disclosed techniques and structures apply equally to other semiconductor structures (e.g., silicon wafers generally).

Alignment of different metal regions, such as positive and negative busbars and contact fingers to doped regions on a solar cell can be a challenging process. Techniques and structures disclosed herein improve precision, throughput, and cost for such alignment.

FIG. 1 illustrates a flow chart of an embodiment for an example method of metallization for a solar cell. In various embodiments, the method of FIG. 1 can include additional (or fewer) blocks than illustrated. For example, in one embodiment, the metal foil can be pre-patterned such that block 170 need not me performed.

As shown in 170, a metal foil can be patterned to form a patterned metal foil. In an embodiment, the patterned metal foil, which can also be referred to as a perforated metal foil, can include a positive busbar and a negative busbar. A positive contact finger can extend from the positive busbar and a negative contact finger can extend from the negative busbar. A metal strip and one or more tabs can connect the positive and negative contact fingers and thus connect the positive and negative busbars. In an embodiment, the tabs can be thinned in the process of patterning. In one embodiment, thinning the tabs can include thinning tabs with a laser. Thinned tabs can, in one embodiment, make the process of removing the strip and tabs easier yet not compromise the alignment of the foil to the solar cell. In an embodiment, the metal foil and patterned metal foil can be aluminum.

In one embodiment, patterning can include removing excess metal from the metal foil that results from the patterning. For example, in some embodiments, a chemical etching (e.g., with mask) or an ablation process, such as a laser ablation process, can be used to pattern the foil. The result of laser ablation can include removing portions of the metal foil corresponding to regions that are patterned (e.g., regions between the fingers that are not connected by the metal strip or tab).

In one embodiment, an alignment procedure can be performed before patterning to align a design to be patterned to the metal foil. An example design includes a design of metal contact fingers (e.g., interdigitated). In one embodiment, alignment can be done using a visual alignment system. In an embodiment, the design can include a computer generated design.

At 172, a patterned metal foil can be placed on a solar cell. In an embodiment, as part of placing the patterned metal foil on solar cell, the patterned metal foil can be aligned to the solar cell using a visual alignment system. Note that the visual alignment system to align the patterned metal foil to the solar cell is, in some embodiments, a different visual alignment system that can be used to pattern the metal foil, as described at block 170. Various visual alignment systems can be used, such as automatic optical alignment systems and various other machine vision applications. In one embodiment, aligning the metal foil to the solar cell can include aligning to doped regions on the solar cell. For example, a positive busbar and corresponding positive contact fingers can be aligned to positively doped regions and a negative busbar and corresponding negative contact fingers can be aligned to negatively doped regions.

At 174, the patterned metal foil can be coupled to the solar cell. In an embodiment, laser welding can be used to couple the patterned metal foil to the first solar cell. In an embodiment, various other techniques can be used to couple the patterned metal foil to the solar cell such as ablation techniques, laser ablation techniques, thermal heating and others. The patterned metal foil can be coupled to doped regions on a silicon substrate of the solar cell. In an embodiment, a positive contact finger can be coupled to a positively doped region and a negative contact finger can be coupled to a negatively doped region. Accordingly coupling the patterned metal foil results in an electrical connection, during operation of the solar cell, between the negative fingers and negatively doped regions and between positive fingers and positively doped regions. Note that coupling can include coupling the foil to the solar cell at multiple different points, as described herein (and shown in various Figures, such as the contact regions 117 shown in FIG. 2).

At 176, the tabs and metal strip can be removed. In an embodiment, the tabs and metal strip can be removed by pulling an edge of the metal strip to separate the positive and negative busbar. In an embodiment, the metal strip and tabs can have multiple edges, where any one of the edges can be pulled to remove the metal strip and tabs holding together the patterned metal foil. In one embodiment, removal of the metal strip and tabs results in separated positive and negative busbars and positive and negative contact fingers. After removing the strip and tabs, the coupling of the metal foil to the solar cell remains in intact such that the negative busbar, negative contact fingers, and negatively doped regions are coupled together and the positive busbar, positive contact fingers, and positively doped regions are separately coupled together.

Figure 8:
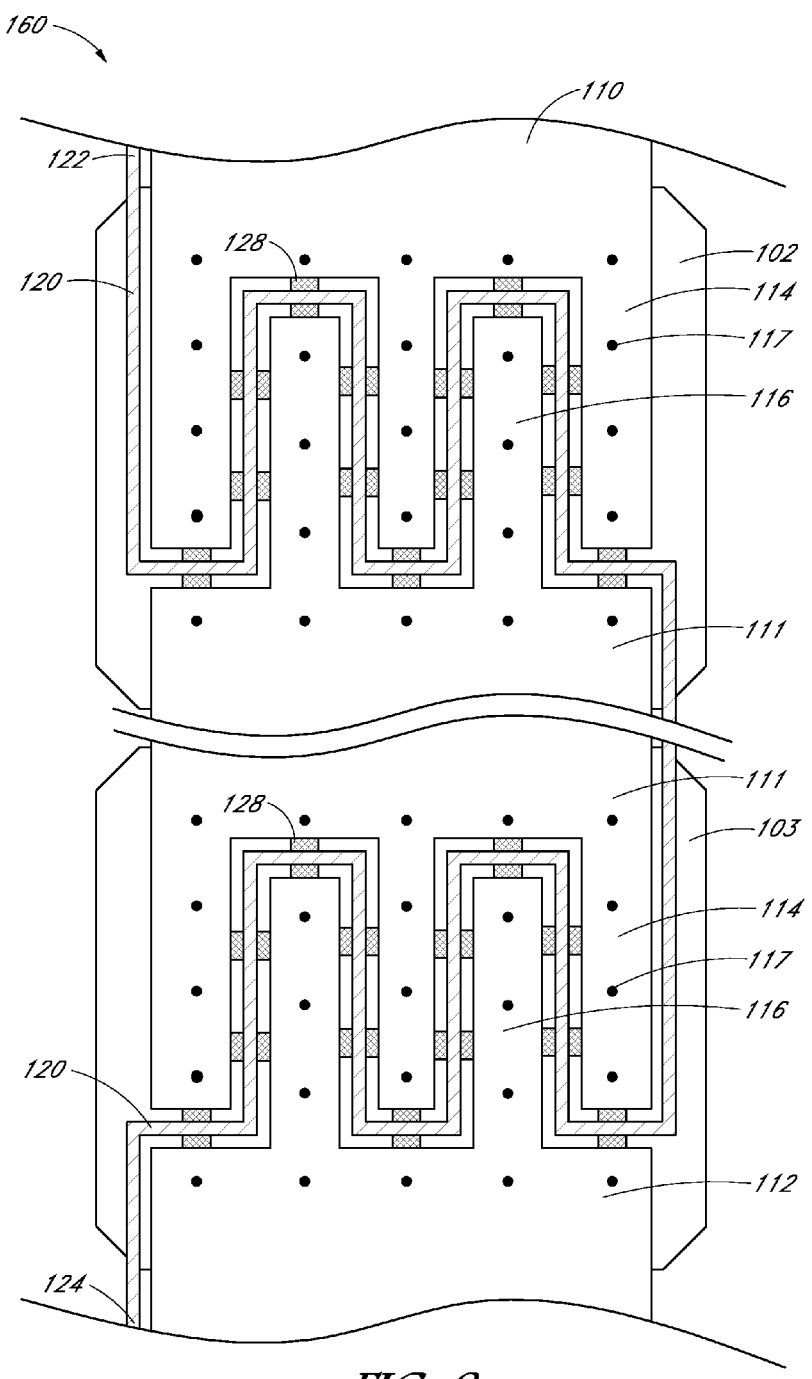
FIG. 8 is a schematic plan view of a string of solar cells, according to some embodiments.
Figure 9:
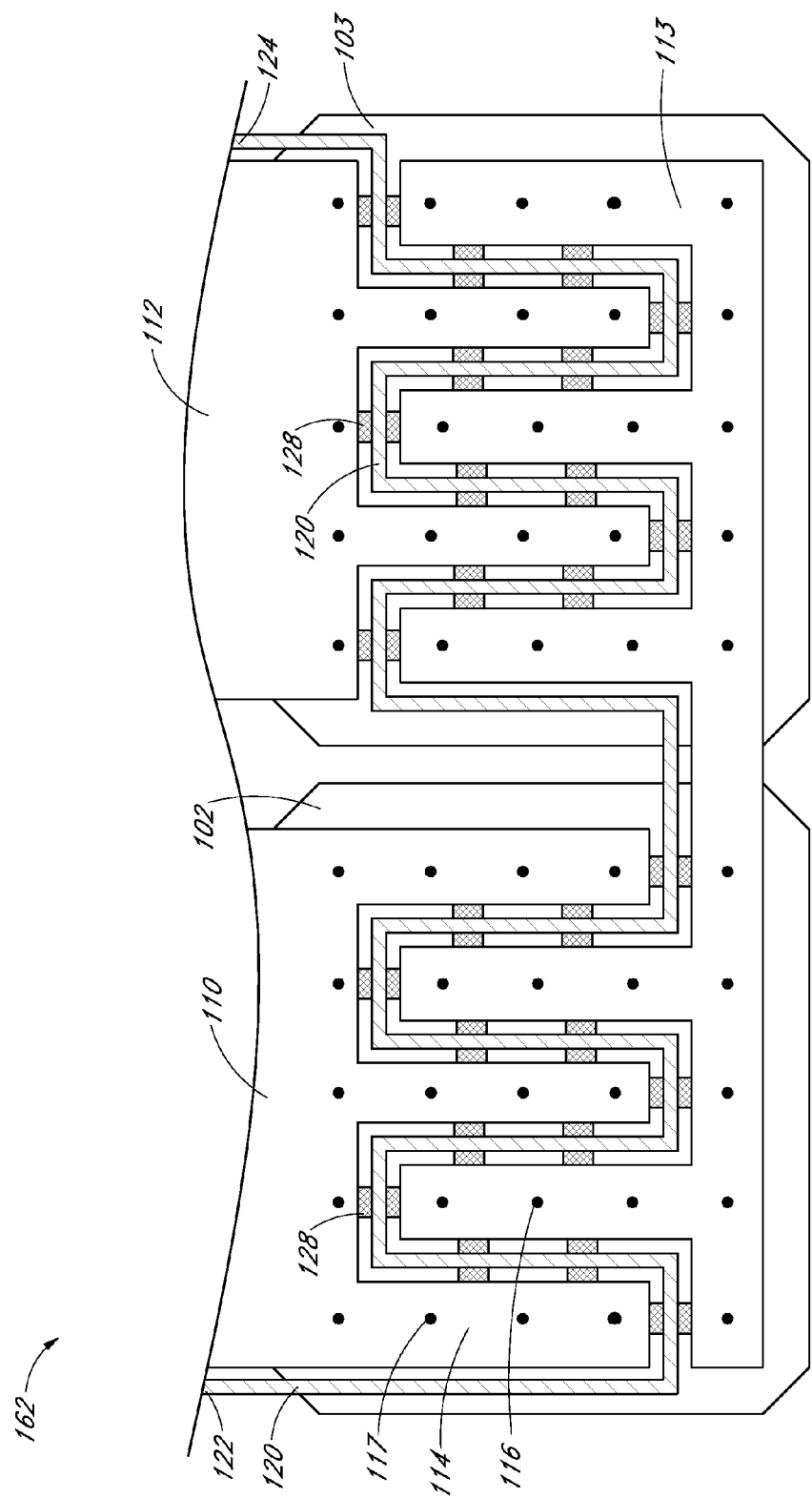
FIG. 9 is a schematic plan view of another string of solar cells, according to some embodiments.

In an embodiment, blocks 170, 172, 174, and 176 can be performed for multiple solar cells. For example, in one embodiment, a patterned metal foil (e.g., including contact fingers for multiple cells) can be aligned and placed on a first solar cell and a second solar cell. The patterned metal foil can then be coupled to the first and second solar cell. Subsequently, the positive and negative busbars of the patterned metal foil can be separated by removing the tabs and metal strip. Note that in some embodiments, the positive and negative busbars corresponding to both the first and second solar cells can be separated by removing a single metal strip (e.g., as shown in FIGS. 8 and 9).

The disclosed techniques can enable transferring of foil after patterning without losing dimension and position accuracy of the foil. In doing so, separate patterning stations and wafer loading stations can be used thereby improving efficiency and reducing cost.

Figure 2:
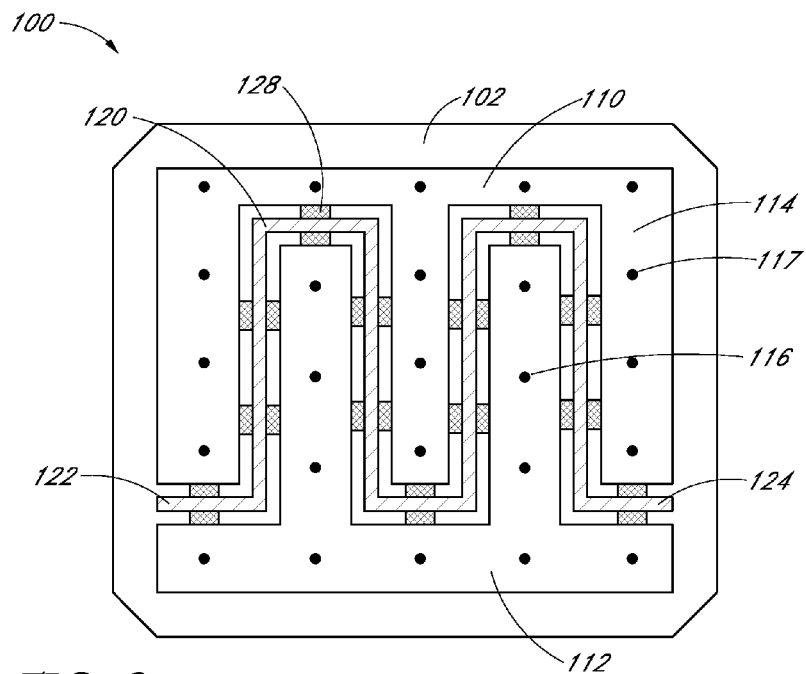
FIG. 2 is a schematic plan view of a patterned metal foil on a solar cell, according to one embodiment.

With reference to FIG. 2, a solar cell 100 is shown that includes a patterned metal foil on a silicon substrate 102. As shown, the patterned metal foil can include a first busbar 110 and a second busbar 112. In an embodiment, the first and second busbars 110, 112 can be positive and negative busbars, respectively. One or more contact fingers (e.g., a first contact finger 114) can extend from the first busbar 110. Likewise, one or more other contact fingers (e.g., a second contact finger 116) can extend from the second busbar 112. In an embodiment, the first contact finger 114 can be a positive contact finger and the second contact finger 116 can be a negative contact finger. In one embodiment, the positive contact finger extends from the positive busbar and the negative contact finger extends from the negative busbar. A metal strip 120 and tabs 128 can connect the first and second contact fingers 114, 116 to one another and thus also connect the first and second busbars 110, 112 to one another. The metal strip 120 can have a first edge 122 and a second edge 124. In an embodiment, the tabs 128 can be thinned. In some embodiments, the tabs can be thinned in the process of patterning. As shown, the patterned metal foil has been placed on the silicon substrate 102 and coupled to the silicon substrate 102 at contact regions 117.

Figure 3:
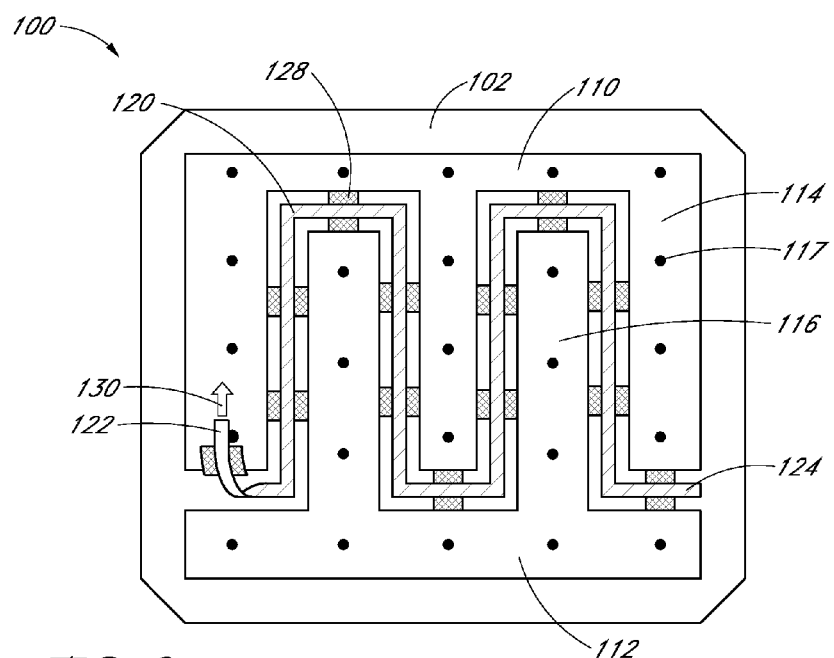
FIGS. 3 and 4 are schematic plan views of removing a metal strip and tabs from a patterned metal foil, according to some embodiments.
Figure 4:
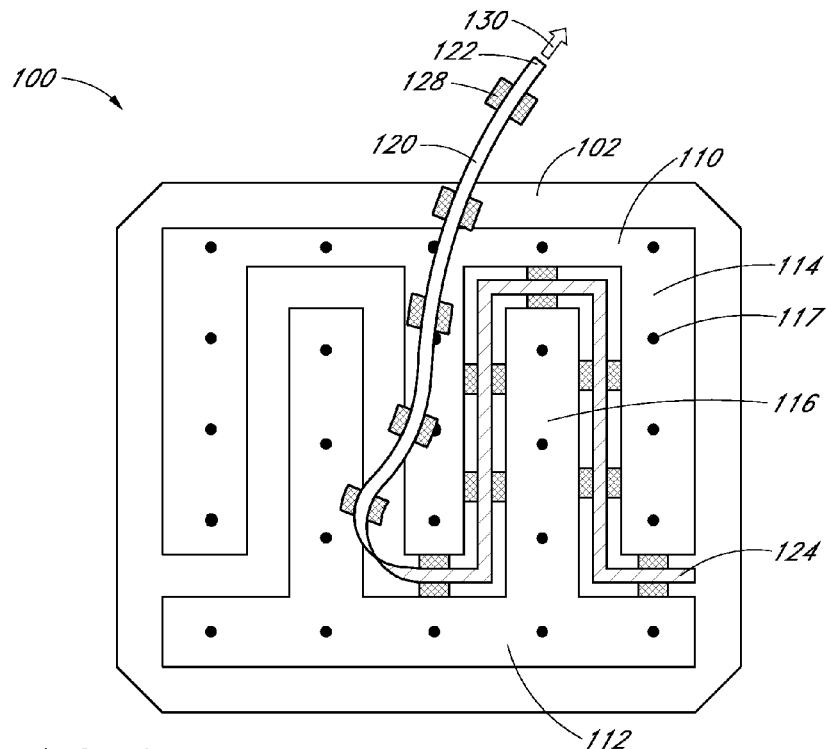

FIGS. 3 and 4 illustrate the removal of the metal strip and tabs from the patterned metal foil. An edge, such as a first edge 122, can be pulled as indicated by arrow 130 to remove the metal strip 120 and tabs 128. Pulling the first edge 122 is shown in FIG. 3. FIG. 4 further illustrates that the metal strip and tabs can be pulled 130 free from the first and second contact fingers 114, 116. Note that remnants of a tab can remain but continuity between the positive and negative fingers may not exist after removal of the strip and tabs even in the presence of tab remnants. In an embodiment, a second edge 124 (or an interior portion of the metal strip) can instead be pulled to remove the metal strip 120 and tabs 128. In an embodiment, the metal strip 120 and tabs 128 can be pulled at any edge, either first 122, second 124 and/or any other edge, to remove the metal strip 120 and tabs 128.

Figure 5:
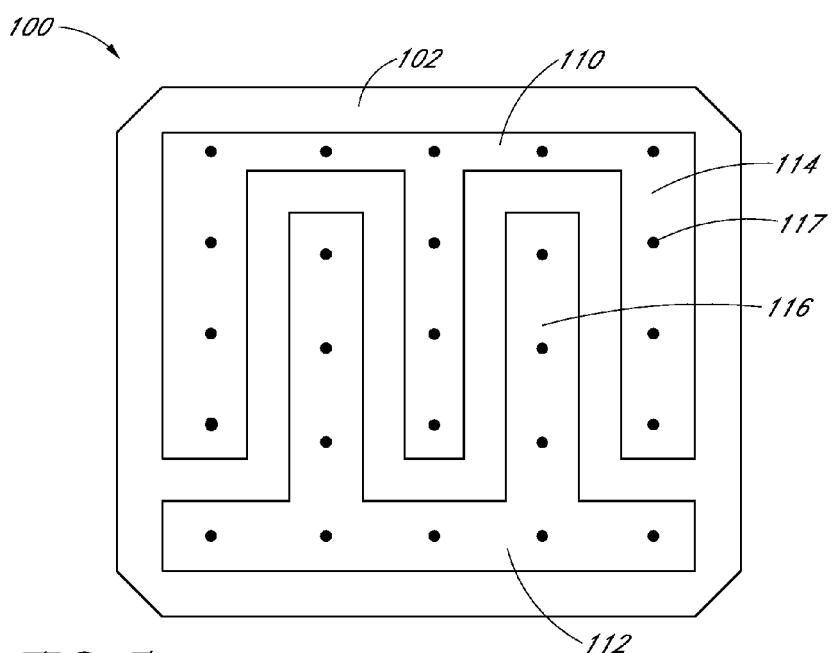
FIG. 5 is a schematic plan view of a solar cell, according to some embodiments.

With reference to FIG. 5, a solar cell 100 subsequent to the removal of the metal strip 120 and tabs 128 is shown. As shown, the solar cell 100 is coupled to the first and second contact fingers 114, 116 through the contact region 117, where the first and second contact fingers 114, 116 extend from the first and second busbars 110, 112, respectively. Note that coupling of the solar cell 100 to the first and second contact fingers 114, 116 can occur in corresponding positively and negatively doped regions of the solar cell such that the positively doped regions of the solar cell are coupled to the positive contact fingers and the negatively doped regions of the solar cell are separately coupled to the negative contact fingers. In an embodiment, the metal strip 120 and tabs 128 can allow for the first and second contact fingers 114, 116 and first and second busbars 110, 112 to be aligned relative to each other, on the silicon substrate 102 of the solar cell 100.

Figure 6:
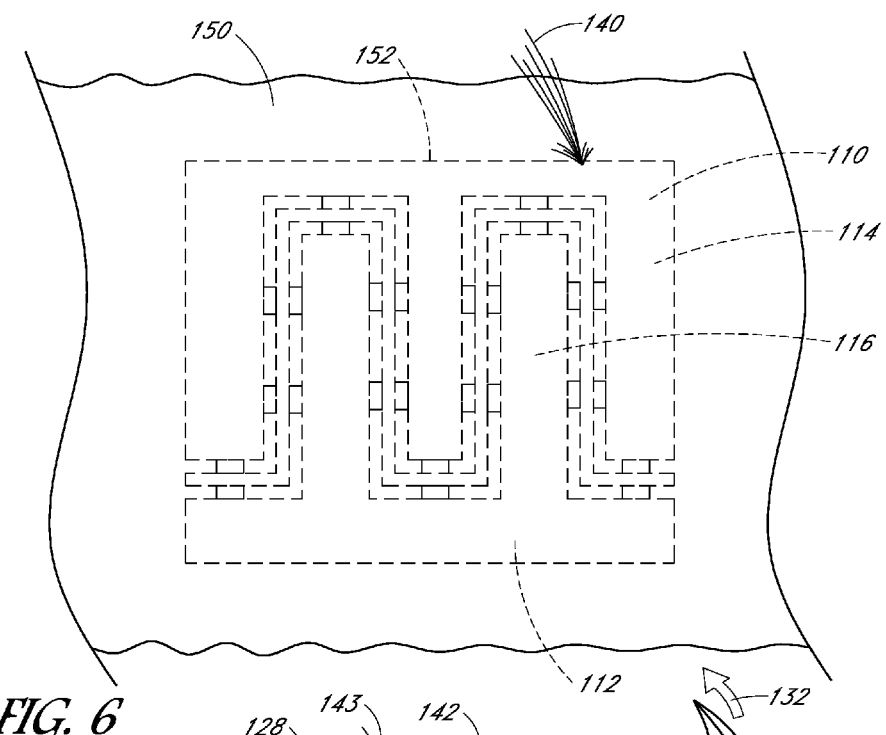
FIGS. 6 and 7 are schematic plan views of forming a patterned metal foil, according to some embodiments.

In an example, FIG. 6 illustrates patterning the metal foil 150 using a laser 140. In an embodiment, various methods can be used to pattern the metal foil such as laser ablation techniques, wet-chemical etching and others. In some embodiments, patterning can include forming an interdigitated pattern 152 (or other contact finger pattern) on the metal foil 150. In one embodiment, the pattern 152 can form a first and second busbar 110, 112 and a first and second contact finger 114, 116. A metal strip and tabs can also be formed in the patterning process. In one embodiment, an alignment procedure can be performed to align a design to the metal foil 150 using a visual alignment system. In an embodiment, the design is a computer generated design.

Figure 7:
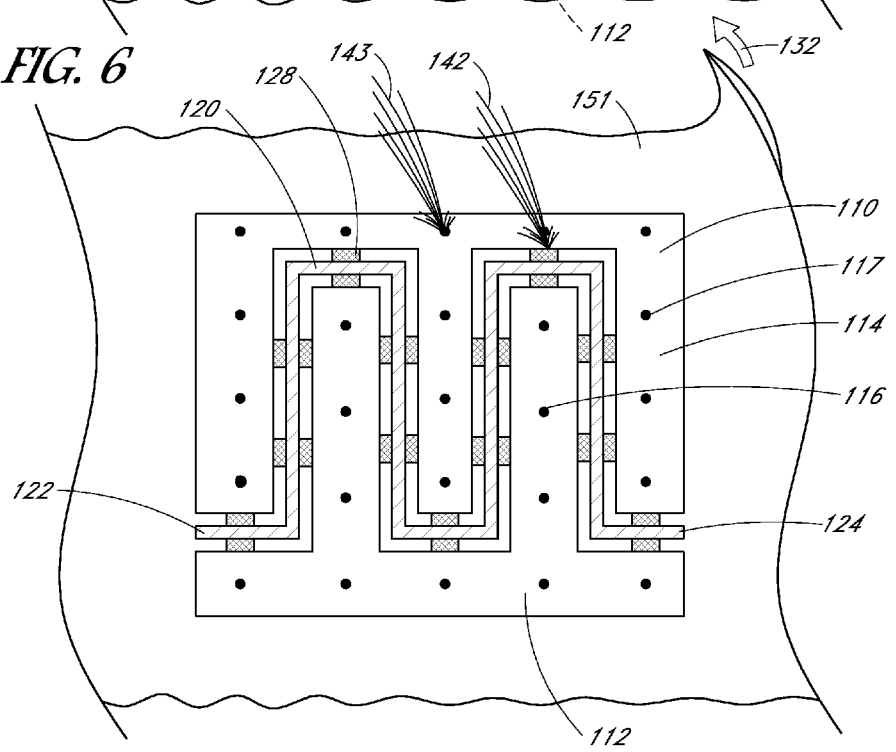

With reference to FIG. 7, various operations can be performed with respect to the patterned foil. Operations can include removing excess metal foil 151 by pulling (as indicated by arrow 132) the excess metal foil 151. In some embodiments, the excess metal foil 151 can be peeled off. Another operation can include forming a metal bond as a contact region 117 to couple the patterned metal foil, including the busbars 110, 112 and contact fingers 114, 116, to a solar cell. In an embodiment, a laser can be used to couple the patterned metal foil to the solar cell. A discussed above, the patterned metal foil can be aligned to a silicon substrate of the solar cell. Another operation can include thinning the tabs 128. A laser can also be used to thin the tabs 128. Thinning the tabs 128 can allow the metal strip 120 and tabs 128 to be more easily removed. Note that thinning the tabs can be performed with a different laser (e.g., different wavelength, different pulse length, etc.) than the laser performing the coupling.

In an embodiment, a carrier medium can be used to hold the metal foil in preparation for the patterning process. In an example, a paper-based carrier medium can hold the metal foil, such that after patterning the paper-based carrier medium can be removed similar to that shown by arrow 132 in FIG. 7, where the paper based carrier medium is removed instead of excess metal foil. Other carrier mediums can be used such as plastic-type carrier mediums and adhesive-type carrier mediums. In another embodiment, the carrier medium includes paper, Ethylene-Vinyl Acetate (EVA), polymeric layer, Polyethylene, any generic plastic and/or any other type of applicable carrier-type material. The operations mentioned can be performed in any order, i.e. excess metal foil 151 can be removed after coupling the patterned metal foil to the solar cell 102 and thinning the tabs 128.

FIG. 8 illustrates a string of multiple solar cells 160. As shown, the string of solar cells 160 can include a first solar cell 102 and a second solar cell 103 connected together by an interconnect 111. Other strings of solar cells can include more than two solar cells. Similar techniques apply to those others strings. In an embodiment, the interconnect 111 can include busbars of different polarity, i.e. positive and negative. For example, the interconnect 111 can include a first and second busbar, one being a busbar for the first solar cell, the other being an opposite polarity busbar for the second solar cell. In one embodiment, a metal strip 120 and tabs 128 couple or connect the interconnect 111, a first busbar 110 and a second busbar 112 together. In an embodiment, the metal strip 120 and tabs 128 allow for improved alignment of the patterned metal foil, which can include the interconnect 111, busbars 110, 112 and their corresponding contact fingers 114, 116, to the first and second solar cells 102, 103. In the metallization process, the metal strip 120 and tabs 128 can be removed by pulling a first edge 122 and/or the second edge 124.

With reference to FIG. 9, there is shown another string of solar cells 162. Similar to FIG. 8, the string of solar cells 162 can include a first solar cell 102 and a second solar cell 103 connected together by an interconnect 113. In an embodiment, the interconnect 113 can include a first and second busbar. In an embodiment, the interconnect 113 can be composed of busbars of different polarity, i.e. positive and negative. In one embodiment, a metal strip 120 and tabs 128 couple or connect the interconnect 113, a first busbar 110 and a second busbar 112 together. In an embodiment, the metal strip 120 and tabs 128 allow for improved alignment of the patterned metal foil, which can include the interconnect 113, busbars 110, 112 and their corresponding contact fingers 114, 116, to the first and second solar cells 102, 103. In the metallization process, the metal strip 120 and tabs 128 can be removed by pulling a first edge 122. In an embodiment, a second edge 124 can be pulled to remove the metal strip 120 and tabs 128. In one embodiment, a single metal strip can hold the busbars in place for multiple solar cells. Accordingly, the single metal strip can be pulled to remove the metal strip and tabs for the multiple solar cells. In other embodiments, multiple metal strips can be pulled to remove the metal strip and tabs for the multiple solar cells. In an embodiment, FIG. 9 can be an example of an edge of two connected solar cell strings.

Figure 10:
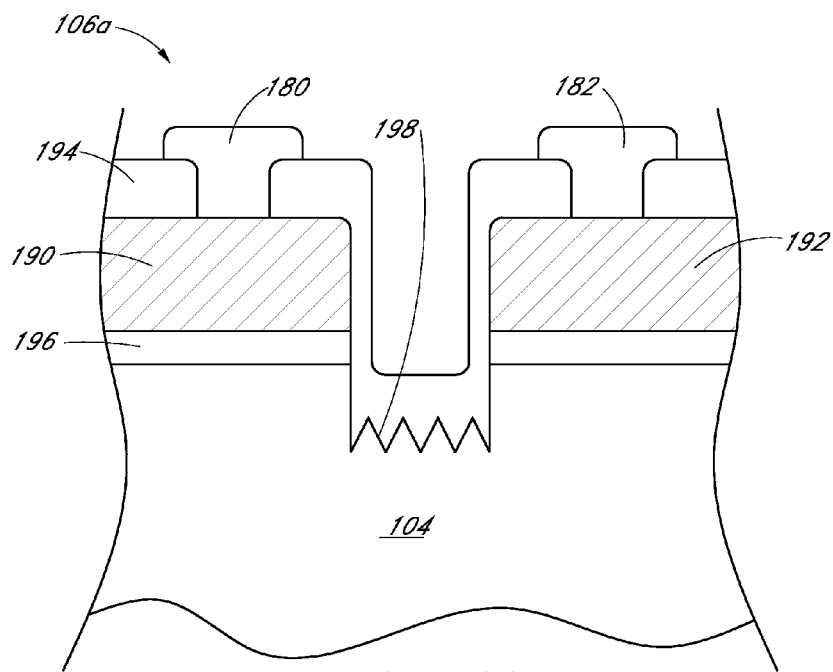
FIG. 10 illustrates a cross-section of an example solar cell fabricated according to the disclosed techniques for metallization.

FIG. 10 illustrates an example solar cell 106a that can be fabricated by using metallization process described above. In the example of the solar cell 106a of FIG. 10, a first doped region 190 and a second doped region 192 can be formed through a thermal process on the silicon substrate 104. In an embodiment, the first and second doped regions 190, 192, each include a doping material but is not limited to a positive-type dopant such as boron or a negative-type dopant such as phosphorous. A first dielectric layer 194 can be formed on the first and second doped regions 190, 192. In an embodiment, the first dielectric layer 194 is silicon nitride (SiN). A second dielectric layer 196 can be formed over the silicon wafer 102 prior to forming the first and second doped regions 190, 192. In an embodiment, the second dielectric layer 196 is a tunnel oxide. In another embodiment, both the first and second doped regions 190, 192 include diffusion regions in an interdigitated pattern. In an embodiment, the first and second doped regions are instead first and second doped polysilicon regions.

In one embodiment, a trench region 198 can be formed to separate both the first and second doped regions 190, 192, which can reduce recombination at the interface. In an embodiment, the trench region 198 includes a textured surface for additional collection of light from the back side of the solar cell 106a. A plurality of contact holes can be formed through the first dielectric layer 194 and on the first and second doped regions 190, 192. Contact holes can be formed through a chemical etch, ablation or any industry standard lithography process. The metallization process described above can be used to form a first and second plurality interdigitated contact fingers 180, 182, where the first and second plurality of interdigitated metal contact fingers 180, 182, are electrically coupled to the contact holes through the first dielectric layer 194 on the first and second doped regions 190, 192 respectively. In an embodiment, a texturized region can be formed on the front side of the solar cell 106a for increased solar radiation collection. A texturized region is one which has a regular or an irregular shaped surface for scattering incoming light, decreasing the amount of light reflected back of the surface of the solar cell 106a. In another embodiment, a third dielectric layer can be formed on the texturized region on the front side of the solar cell 106a. In one embodiment, the third dielectric layer is a silicon nitride (SiN). In some embodiments, the first 194 and third dielectric layers are anti-reflective layers.

Figure 11:
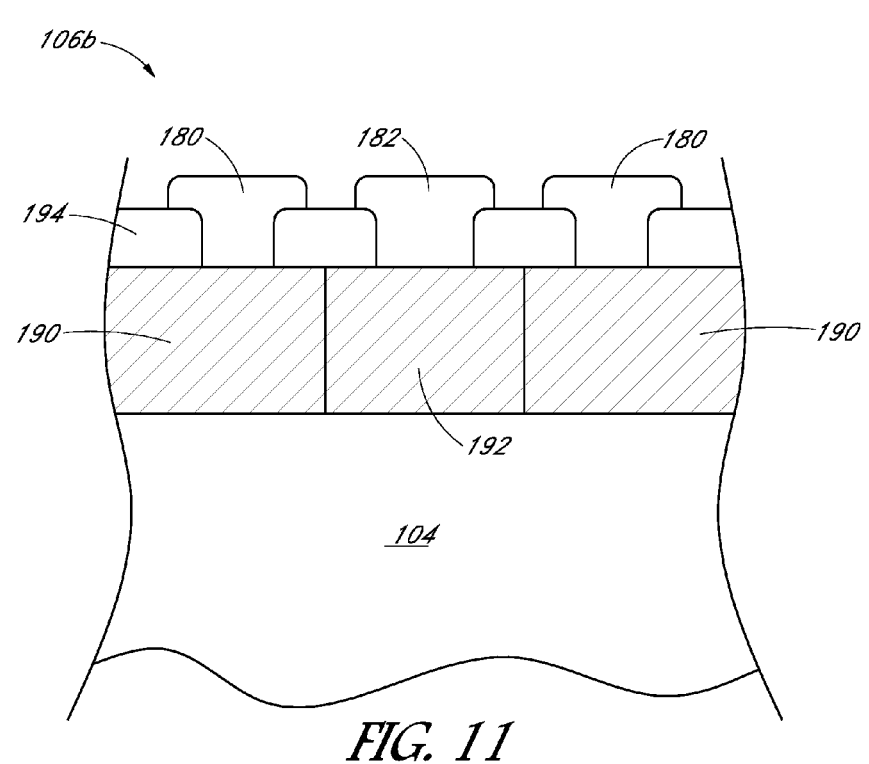
FIG. 11 illustrates a cross-section of another example solar cell fabricated according to the disclosed techniques for metallization.

Turning now to FIG. 11, an example solar cell 106b that is fabricated by using metallization process described above is shown. Similar to that described in FIG. 10. In an example solar cell fabrication process, a first doped region 190 and a second doped region 192 can be formed through a thermal process on a silicon substrate 104. In another embodiment, the first and second doped regions 190, 192, each include a doping material but is not limited to a positive-type dopant such as boron or a negative-type dopant such as phosphorous. A first dielectric layer 194 can be formed on the first and second doped regions 190, 192. In an embodiment, the first dielectric layer 194 is silicon nitride (SiN). A second dielectric layer can be formed over the silicon substrate 104 prior to forming the first and second doped regions 190, 192. In an embodiment, the second dielectric layer is a tunnel oxide. In another embodiment, both the first and second doped regions 190, 192 include diffusion regions in an interdigitated pattern. In one embodiment, a plurality of contact holes can be formed through the first dielectric layer 194 and on the first and second doped regions 190, 192. Contact holes can be formed through a chemical etch, ablation or any industry standard lithography process. The metallization process described above can be used to form a first and second plurality interdigitated contact fingers 180, 182, where the first and second plurality of interdigitated metal contact fingers 180, 182, are electrically coupled to the contact holes through the first dielectric layer 194 on the first and second doped regions 190, 192 respectively. In an embodiment, a texturized region can be formed on the front side of the solar cell 106b for increased solar radiation collection. A texturized region is one which has a regular or an irregular shaped surface for scattering incoming light, decreasing the amount of light reflected back of the surface of the solar cell 106b. In one embodiment, a third dielectric layer can be formed on the texturized region on the front side of the solar cell 106b. In another embodiment, the third dielectric layer is silicon nitride (SiN). In yet another embodiment, the first 194 and third dielectric layers are anti-reflective layers.

Figure 12:
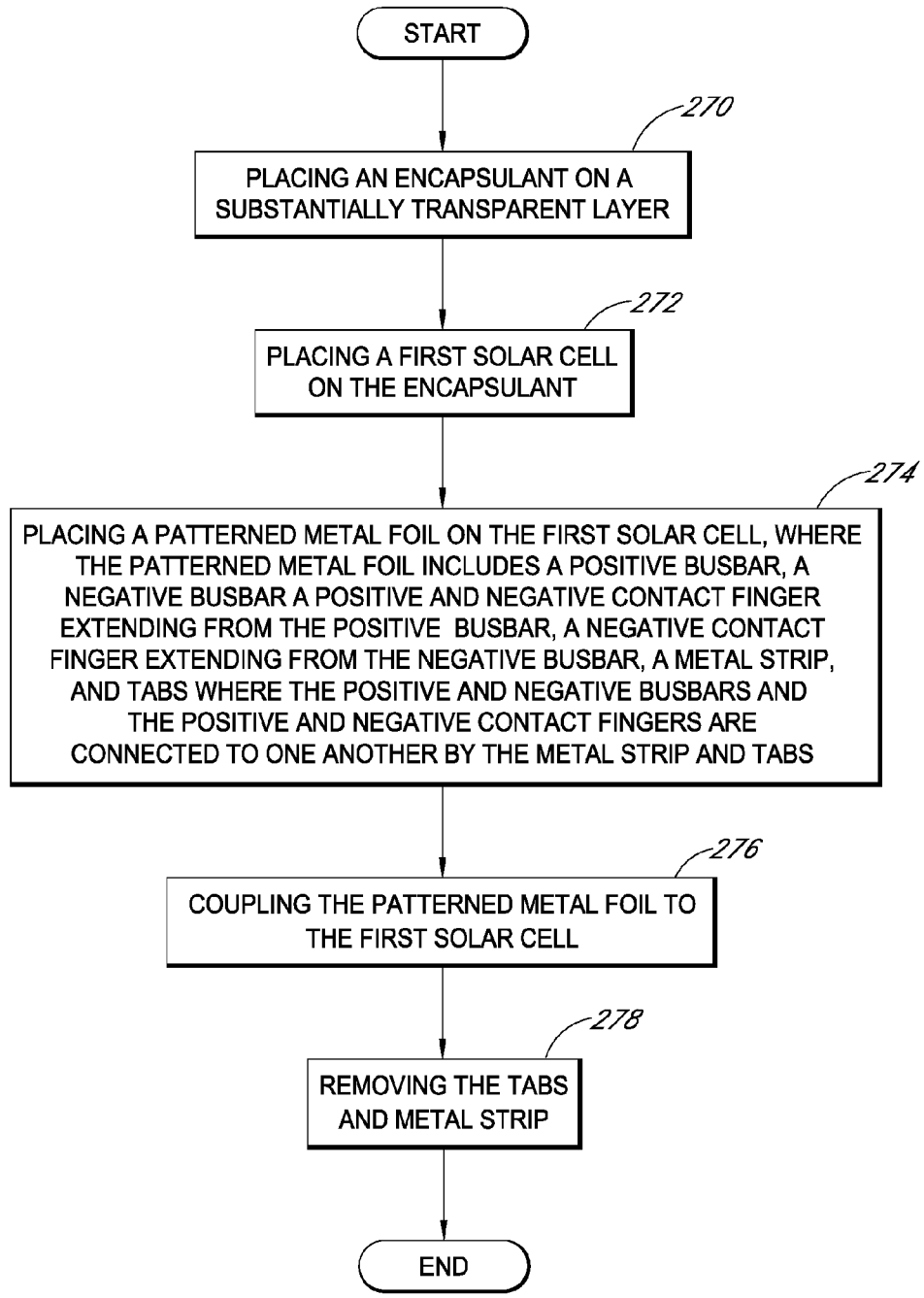
FIG. 12 is a flow chart representation of an example method for metallization of a photovoltaic module, according to some embodiments.

FIG. 12 illustrates a flow chart of an embodiment for an example method of metallization for a photovoltaic module. In various embodiments, the method of FIG. 12 can include additional (or fewer) blocks than illustrated. Additionally, many of the blocks of FIG. 12 are similar to blocks of FIG. 1. In such instances, the description at FIG. 1 and throughout the specification applies equally to the description of FIG. 12.

As shown in 270 an encapsulant can be placed on a substantially transparent layer. In an embodiment, the substantially transparent layer can be glass. In some embodiments, the encapsulant can be Ethylene-Vinyl Acetate (EVA).

At 272, a first solar cell can be placed on the encapsulant. In some embodiments, a plurality of solar cells can be placed on the encapsulant. In an embodiment, the first solar cell can be aligned to the encapsulant using a visual alignment system.

At 274, similar to block 172 of FIG. 1, a patterned metal foil can be placed on the first solar cell. In an embodiment, the patterned metal foil can be placed on the first solar cell using a visual alignment system. Various visual alignment systems can be used such as automatic optical alignment systems and various other machine vision applications. The patterned metal foil can also be aligned to doped regions on the solar cell, where a positive busbar and contact fingers can be aligned to positively doped regions and a negative busbar and contact fingers can be aligned to negatively doped regions.

As described herein, in one embodiment, the patterned metal foil can include a positive busbar and a negative busbar. A positive contact finger can extend from the positive busbar and a negative contact finger can extend from the negative busbar. A metal strip and tabs can connect the positive and negative contact fingers and thus connect the positive and negative busbars. In an embodiment, the tabs can be thinned during the process of patterning. In one embodiment, thinning the tabs can include thinning tabs with a laser. In an embodiment, the metal foil and patterned metal foil can be aluminum. In some embodiments, the patterning can be done externally such that the patterning step can be removed from the operation and patterned metal foil provided as an incoming material using the operations as shown.

In one embodiment, the patterned metal foil can be formed by a patterning process such as by ablation, laser ablation, etching, wet-chemical etching and others. The patterning can further include removing excess metal from the metal foil that results from the patterning. In one embodiment, patterning the metal foil includes performing an alignment procedure to align a design to the metal foil using a visual alignment system. In an embodiment, the design can include a computer generated design.

At 276, similar to block 174 of FIG. 1, a patterned metal foil can be coupled to the first solar cell. In an embodiment, laser welding can be used to couple the patterned metal foil to the first solar cell. In an embodiment, various other techniques can be used to couple the patterned metal foil to the solar cell such as ablation techniques, laser ablation techniques, thermal heating and others.

At 278, similar to block 176 of FIG. 1, the metal strip and tabs can be removed. In an embodiment, the tabs and metal foil can be removed by pulling an edge of the metal strip to separating the positive and negative busbar. In an embodiment, the metal strip and tabs can have multiple edges, where any one of the edges can be pulled to remove the metal strip and tabs holding together the patterned metal foil. In one embodiment, removal of the metal strip and tabs results in separated positive and negative busbars and positive and negative contact fingers such that the positive busbar and fingers are coupled to one another (and to the positively doped regions) and the negative busbar and fingers are coupled to one another (and to the negatively doped regions)

In various embodiments, the method of FIG. 12 can apply to multiple solar cells. For instance, a second solar cell can be placed on the encapsulant (e.g., prior to placing the patterned metal foil). In an embodiment, the patterned metal foil (same or different than the one placed on the first solar cell) can be placed on the second solar cell. If the same foil, the patterned metal foil can be placed on both the first and second solar cells. The patterned metal foil can also be coupled to the first and second solar cell. The metal strip and tabs can be removed from the patterned metal foil, where the removal of the metal strip and tabs allows for the physical separation between opposite polarity busbars and contact fingers of the patterned metal foil. As discussed above, the patterned metal foil can be coupled to the first and second solar cell using various methods such as a laser welding technique, ablation techniques, laser ablation, heating, thermal heating and others. In an embodiment, the tabs can be thinned within the patterning process. In one embodiment, thinning the tabs can help more easily remove the metal strip and tabs.

Figure 13:
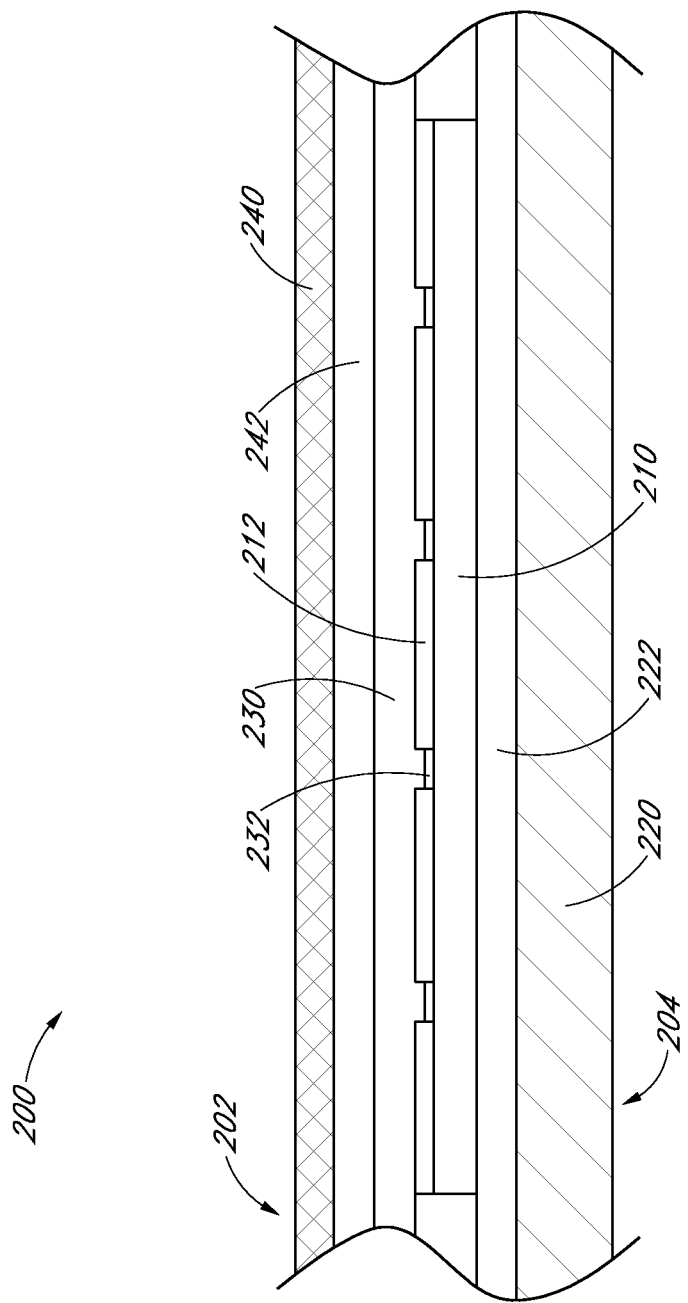
FIG. 13 illustrates a cross-section of a photovoltaic module fabricated according to the disclosed techniques for metallization.

With reference to FIG. 13, a cross-sectional view of a photovoltaic module 200 that is fabricated by using the metallization process is shown. The photovoltaic module 200 can have a front side 204 and a back side 202, the back side 202 opposite the front side 204. In an embodiment, the front side 204 faces the sun during normal operation of the photovoltaic module 200. A first encapsulant 222 can be positioned on a substantially transparent layer 220. Substantially transparent includes completely transparent as well as transparency greater than 80% transparency. As one example, the substantially transparent layer 220 can be made of glass (e.g., clear, colored, etc.). In an embodiment, the first encapsulant can be Ethylene-Vinyl Acetate (EVA). A first solar cell 210 can be placed on the first encapsulant 222. In some embodiments, a plurality of solar cells can be positioned on the first encapsulant 222. In an embodiment, the first solar cell 210 can be aligned to the first encapsulant 222 using a visual alignment system.

In an embodiment, a patterned metal foil 230 can be placed on the first solar cell 210. In an embodiment, the patterned metal foil 230 can be aligned to the first solar cell 210 using a visual alignment system. In an embodiment, the patterned metal foil 230 can be placed on one or more solar cells (e.g., a second solar cell (not shown in FIG. 13)). In an embodiment, the patterned metal foil 230 can be aligned to the one or more solar cells using a visual alignment system. As described herein, the patterned metal foil 230 can include a positive busbar and a negative busbar. A positive contact finger can extend from the positive busbar and a negative contact finger can extend from the negative busbar. A metal strip and tabs can connect the positive and negative contact fingers and thus connect the positive and negative busbars. In an embodiment, the metal foil and patterned metal foil can be aluminum. The patterned metal foil 230 can be coupled to a seed metal layer 232 through contact holes on a dielectric layer 212 of the first solar cell 210. In an embodiment, the patterned metal foil 230 can be electrically coupled to the seed metal layer 232. In an embodiment, the patterned metal foil 230 can be coupled to a second solar cell. In one embodiment, the patterned metal foil 230 can be coupled to a plurality of solar cells. In an embodiment, the dielectric layer 212 can include silicon nitride (SiN). In one embodiment, the dielectric layer 212 can be an anti-reflective layer. A backing material 242 can be positioned on the patterned metal foil 230. In an embodiment, the backing material 242 can be a second encapsulant. In some embodiments, the second encapsulant can be Ethylene-Vinyl Acetate (EVA). A back layer 240 can be positioned on the backing material 242. In an embodiment, the back layer 240 can be a backsheet commonly used in the fabrication of photovoltaic modules or photovoltaic laminates 200.

It should be appreciated that the various tasks performed in connection with the metallization process discussed above and subsequently a solar cell manufacturing process can include any number of additional or alternative tasks. The tasks shown in FIG. 1-13 need not be performed in the illustrated order, and additional steps may be incorporated into a more comprehensive procedure or process having additional functionality not described in detail herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method for metallization of a first solar cell, the method comprising:
   placing a patterned metal foil on the first solar cell, wherein the patterned metal foil comprises a positive busbar, a negative busbar, a positive contact finger extending from the positive busbar, a negative contact finger extending from the negative busbar, a metal strip, and a tab, wherein the positive and negative busbars and the positive and negative contact fingers are connected to one another by the metal strip and the tab;
   coupling the patterned metal foil to the first solar cell; and
   removing the tab and metal strip, wherein after said removing, the positive and negative busbars are not connected to one another.

2. The method of claim 1, wherein placing a patterned metal foil on the first solar cell comprises aligning the patterned metal foil to the first solar cell using a visual alignment system.

3. The method of claim 1, wherein prior to placing a patterned metal foil on a first solar cell, the method further comprises:
   patterning a metal foil resulting in the patterned metal foil; and
   removing excess metal from the metal foil that results from the patterning.

4. The method of claim 1, wherein placing a patterned metal foil on the first solar cell comprises:
   placing a metal foil on the first solar cell; and
   patterning the metal foil on the first solar cell resulting in the patterned metal foil.

5. The method of claim 4, wherein patterning the metal foil comprises performing an alignment procedure to align a design to the metal foil using a visual alignment system.

6. The method of claim 1, further comprising thinning the tabs.

7. The method of claim 6, wherein thinning the tabs comprises using a laser.

8. The method of claim 1, wherein coupling the patterned metal foil to the first solar cell comprises laser welding the patterned metal foil to the first solar cell.

9. The method of claim 1, wherein placing the patterned metal foil on the first solar cell comprises placing a patterned metal foil comprising aluminum on the first solar cell.

10. A method for metallization of a first solar cell, the method comprising:
    patterning a metal foil using an ablation process;
    placing the patterned metal foil on the first solar cell using a visual alignment system, wherein the patterned metal foil comprises a positive busbar, a negative busbar, a positive contact finger extending from the positive busbar, a negative contact finger extending from the negative busbar, a metal strip, and tabs, wherein the positive and negative busbars and the positive and negative contact fingers are connected to one another by the metal strip and tabs;
    coupling the patterned metal foil to the first solar cell; and
    removing the tabs and metal strip by pulling an edge of the metal strip.

11. The method of claim 10, wherein patterning the metal foil comprises performing an alignment procedure to align a design to the metal foil using a visual alignment system.

12. The method of claim 11, wherein the design comprises a computer generated design.

13. The method of claim 10 further comprising thinning the tabs.

14. The method of claim 13, wherein thinning the tabs is performed using a laser.

15. The method of claim 10, wherein coupling the patterned metal foil to the first solar cell comprises laser welding the patterned metal foil to the first solar cell.

16. The method of claim 10, wherein placing the patterned metal foil on the first solar cell comprises placing a patterned metal foil comprising aluminum on the first solar cell.

17. A method for metallization of a photovoltaic laminate, the method comprising:
    placing an encapsulant on a substantially transparent layer;
    placing a first solar cell on the encapsulant;
    placing a patterned metal foil on the first solar cell, wherein the patterned metal foil comprises a positive busbar, a negative busbar, a positive contact finger extending from the positive busbar, a negative contact finger extending from the negative busbar, a metal strip, and tabs, wherein the positive and negative busbars and the positive and negative contact fingers are connected to one another by the metal strip and tabs;
    coupling the patterned metal foil to the first solar cell; and
    removing the tabs and metal strip.

18. The method of claim 17 further comprising:
    placing a second solar cell on the encapsulant prior to placing the patterned metal foil;
    where placing the patterned metal foil on the first solar cell also includes placing the patterned metal foil on the second solar cell;
    coupling the patterned metal foil to the first and second solar cell; and
    removing the tabs and metal strip.

19. The method of claim 17 further comprising thinning the tabs using a laser.

20. The method of claim 17, wherein coupling the patterned metal foil to the first and second solar cell comprises laser welding the patterned metal foil.

* * * * *

UNITED STATES PATENT AND TRADEMARK OFFICE
CERTIFICATE OF CORRECTION

Page 1 of 1

PATENT NO. : 9,112,097 B2
APPLICATION NO. : 14/040177
DATED : August 18, 2015
INVENTOR(S) : Xiuwen Tu It is certified that error appears in the above-identified patent and that said Letters Patent is hereby corrected as shown below:

In the claims

In column 12, line 51, claim 20, delete "17" and insert -- 18 --.

Signed and Sealed this
Twenty-second Day of December, 2015

Michelle K. Lee
*Director of the United States Patent and Trademark Office*